United States Patent
Qi et al.

(10) Patent No.: US 12,038,232 B2
(45) Date of Patent: Jul. 16, 2024

(54) SINTERING DEVICES AND PRESSURE SINTERING MECHANISMS WITH CONTROLLABLE ATMOSPHERE THEREOF

(71) Applicant: QUICK INTELLIGENT EQUIPMENT CO., LTD., Jiangsu (CN)

(72) Inventors: Guoqiang Qi, Changzhou (CN); Xiaoming Dou, Changzhou (CN); Jiawei Jiang, Changzhou (CN); Youzhi Yang, Changzhou (CN); Yuan Liu, Changzhou (CN)

(73) Assignee: QUICK INTELLIGENT EQUIPMENT CO., LTD., Changzhou (CN)

( * ) Notice: Subject to any disclaimer, the term of this patent is extended or adjusted under 35 U.S.C. 154(b) by 0 days.

(21) Appl. No.: 18/466,018

(22) Filed: Sep. 13, 2023

(65) Prior Publication Data
US 2023/0417487 A1    Dec. 28, 2023

Related U.S. Application Data

(63) Continuation-in-part of application No. PCT/CN2022/099299, filed on Jun. 17, 2022.

(30) Foreign Application Priority Data

Jan. 24, 2022 (CN) .......................... 202210080776.3

(51) Int. Cl.
*F27B 5/04* (2006.01)
*H01L 21/67* (2006.01)

(52) U.S. Cl.
CPC ........... *F27B 5/04* (2013.01); *F27M 2003/04* (2013.01); *H01L 21/67098* (2013.01)

(58) Field of Classification Search
CPC .... B22F 3/00; B22F 3/003; B22F 3/12; B22F 3/17
(Continued)

(56) References Cited

U.S. PATENT DOCUMENTS 3,971,875 A * 7/1976 Regalbuto ................. B22F 3/14
219/390
5,297,480 A * 3/1994 Miyashita ............. B30B 15/061
156/583.1
(Continued)

FOREIGN PATENT DOCUMENTS

CN          2398038 Y      9/2000
CN        201373664 Y    12/2009
(Continued)

OTHER PUBLICATIONS

International Search Report in PCT/CN2022/099299 mailed on Oct. 24, 2022, 6 pages.
(Continued)

*Primary Examiner* — Steven B McAllister
*Assistant Examiner* — John E Bargero
(74) *Attorney, Agent, or Firm* — PORUS IP LLC

(57) ABSTRACT

Embodiments of the present disclosure provide a sintering device and a pressure sintering mechanism with a controllable atmosphere thereof. The pressure sintering mechanism with the controllable atmosphere includes: a telescopic tube, wherein at least a part of the telescopic tube is an elastically telescopic bellows section; two pressure components arranged opposite to each other, wherein the telescopic tube is configured between the two pressure components, the two pressure components are configured to seal an opening of an end of the telescopic tube when the two pressure components are close to each other to form a sealed sintering chamber inside the telescopic tube and apply pressure to a
(Continued)

product inside the sintering chamber; and a heating component configured to heat the product inside the sintering chamber.

9 Claims, 11 Drawing Sheets

(58) Field of Classification Search
USPC .......................................................... 432/207
See application file for complete search history.

(56) References Cited

U.S. PATENT DOCUMENTS

2007/0080156 A1* 4/2007 Seo ................... H01L 21/67757
219/383
2011/0017808 A1 1/2011 Eisele et al.

FOREIGN PATENT DOCUMENTS

| CN | 101786161 A | 7/2010 |
| CN | 106796898 A | 5/2017 |
| CN | 114608311 A | 6/2022 |

OTHER PUBLICATIONS

Written Opinion in PCT/CN2022/099299 mailed on Oct. 24, 2022, 11 pages.

* cited by examiner

SINTERING DEVICES AND PRESSURE SINTERING MECHANISMS WITH CONTROLLABLE ATMOSPHERE THEREOF

CROSS-REFERENCE TO RELATED APPLICATIONS

This application is a continuation-in-part of International Application No. PCT/CN2022/099299, filed on Jun. 17, 2022, which claims priority to Chinese Patent Application No. 202210080776.3, filed on Jan. 24, 2022, the entire contents of each of which are hereby incorporated by reference.

TECHNICAL FIELD

The present disclosure relates to the technical field of sintering devices, and in particular, to a sintering device and a pressure sintering mechanism with a controllable atmosphere.

BACKGROUND

In the field of semiconductor chip packaging, a common method for achieving a connection between a chip and a substrate is through a sintering bonding process, which is a crucial step in the entire semiconductor chip packaging process. The existing sintering device mainly consists of a sintering chamber and two pressure heads for applying pressure to the product. The sintering chamber is a closed chamber that is divided into a rigid structure and a flexible structure. Its purpose is to maintain the product to be sintered and bonded in a controlled atmosphere.

The main drawback of a sintering device with a rigid structure sintering chamber is that it requires two sets of driving devices. One set is used to close the sintering chamber with the rigid structure, and the other set is used to drive the pressure head to apply pressure, which results in issues such as a high number of components and high costs. The main drawback of a sintering device with a sintering chamber with a flexible structure is its limitation to operating in a large pressure range (e.g., a range with pressure greater than 1 ton) and its unsuitability for a small pressure range (e.g., a range with pressure less than 100 kg).

Therefore, it is necessary to provide a sintering device and a pressure sintering mechanism with a controllable atmosphere to address the problem of using a flexible structure as the sintering chamber for a sintering device operating in the small pressure range.

SUMMARY

One or more embodiments of the present disclosure provide a pressure sintering mechanism with a controllable atmosphere, including a telescopic tube, wherein at least a part of the telescopic tube is an elastically telescopic bellows section; two pressure components arranged opposite to each other, wherein the telescopic tube is configured between the two pressure components, the two pressure components are configured to seal an opening of an end of the telescopic tube when the two pressure components are close to each other to form a sealed sintering chamber inside the telescopic tube and apply pressure to a product inside the sintering chamber; and a heating component configured to heat the product inside the sintering chamber.

In some embodiments, two ends of the telescopic tube are respectively a fixed end and a free end, one of the pressure components is fixedly sealed and connected to the fixed end of the telescopic tube to seal an opening of the fixed end of the telescopic tube, and the other one is arranged opposite to an opening of the free end of the telescopic tube.

In some embodiments, the two pressure components consist of an upper pressure component and a lower pressure component, the upper pressure component is located above the lower pressure component, the fixed end of the telescopic tube is fixedly connected to the upper pressure component, and a sealing ring is arranged between the fixed end of the telescopic tube and the upper pressure component.

In some embodiments, the upper pressure component includes an upper pressure head, the upper pressure head has an extension portion protruding downwardly from a lower surface of the upper pressure head, and the extension portion extends into the telescopic tube; and the heating component includes an upper heating element arranged on the upper pressure head.

In some embodiments, an upper heating chamber is arranged downwardly on an upper surface of the upper pressure head, a bottom end of the upper heating chamber is located in the extension portion, and the upper heating element is arranged on the bottom end of the upper heating chamber; and the upper pressure component further includes an upper pressure head base located above the upper pressure head, the upper pressure head base is fixedly connected to the upper pressure head and seals an upper end opening of the upper heated chamber, and the fixed end of the telescopic tube is fixedly connected to the upper pressure head base or the upper pressure head.

In some embodiments, the lower pressure component includes a lower pressure head, the lower pressure head has a lower heating chamber and an insulating venting slot surrounding outside of the lower heating chamber, the lower heating chamber has an opening facing downward and the insulating venting slot has an opening facing upward, and the insulating venting slot is connected to the sintering chamber when the telescopic tube forms the sintering chamber; and an annular slot is arranged on an upper surface of the lower pressure head or the free end of the telescopic tube, a sealing ring is embedded in the annular slot, and the insulating venting slot is located on an inner side of the sealing ring; the heating component includes a lower heating element, the lower heating element is configured within the lower heating chamber; and an outer wall of the lower pressure head is arranged with an air inlet and an air outlet, and the air inlet and the air outlet are connected to the insulating venting slot.

In some embodiments, the lower pressure head has a projection portion protruding upwardly corresponding to an upper surface of the lower heating chamber, and the insulating venting slot is located on an outer side of the projection portion.

In some embodiments, the insulating venting slot is arranged with two partitions and is separated by the two partitions to form an air inlet slot and an air outlet slot, the air inlet is connected to the air inlet slot, and the air outlet is connected to the air outlet slot.

In some embodiments, an upper end opening of the insulating venting slot is covered with a rectification plate, a plurality of through holes downwardly run through the rectification plate from an upper surface of the rectification plate, the plurality of through holes are evenly distributed circumferentially along the insulating venting slot and are connected to the insulating venting slot.

One or more embodiments of the present disclosure provide a sintering device including the pressure sintering mechanism with the controllable atmosphere.

In some embodiments, the sintering device further includes a frame, a drive device, a guide rail, a fixed support plate, and a movable support plate; wherein the guide rail is set on the frame, and the movable support plate is slidingly arranged on the guide rail; the frame supports the fixed support plate, and a pressure sensor is arranged between the frame and the fixed support plate; the two pressure components are fixed to the movable support plate and the fixed support plate, respectively; and an output end of the drive device is connected to the two pressure components slidingly arranged on the guide rail and is configured to drive the pressure components to reciprocate linearly along the guide rail.

In some embodiments, a heat insulating plate is arranged between the movable support plate and a pressure component above the movable support plate, and a heat insulating plate is arranged between the fixed support plate and a pressure component above the fixed support plate.

BRIEF DESCRIPTION OF THE DRAWINGS

The present disclosure may be further illustrated by way of exemplary embodiments, which may be described in detail by way of the accompanying drawings.

These embodiments are non-limiting, and in these embodiments, a same number indicates a same structure, wherein.

DETAILED DESCRIPTION

Figure 1:
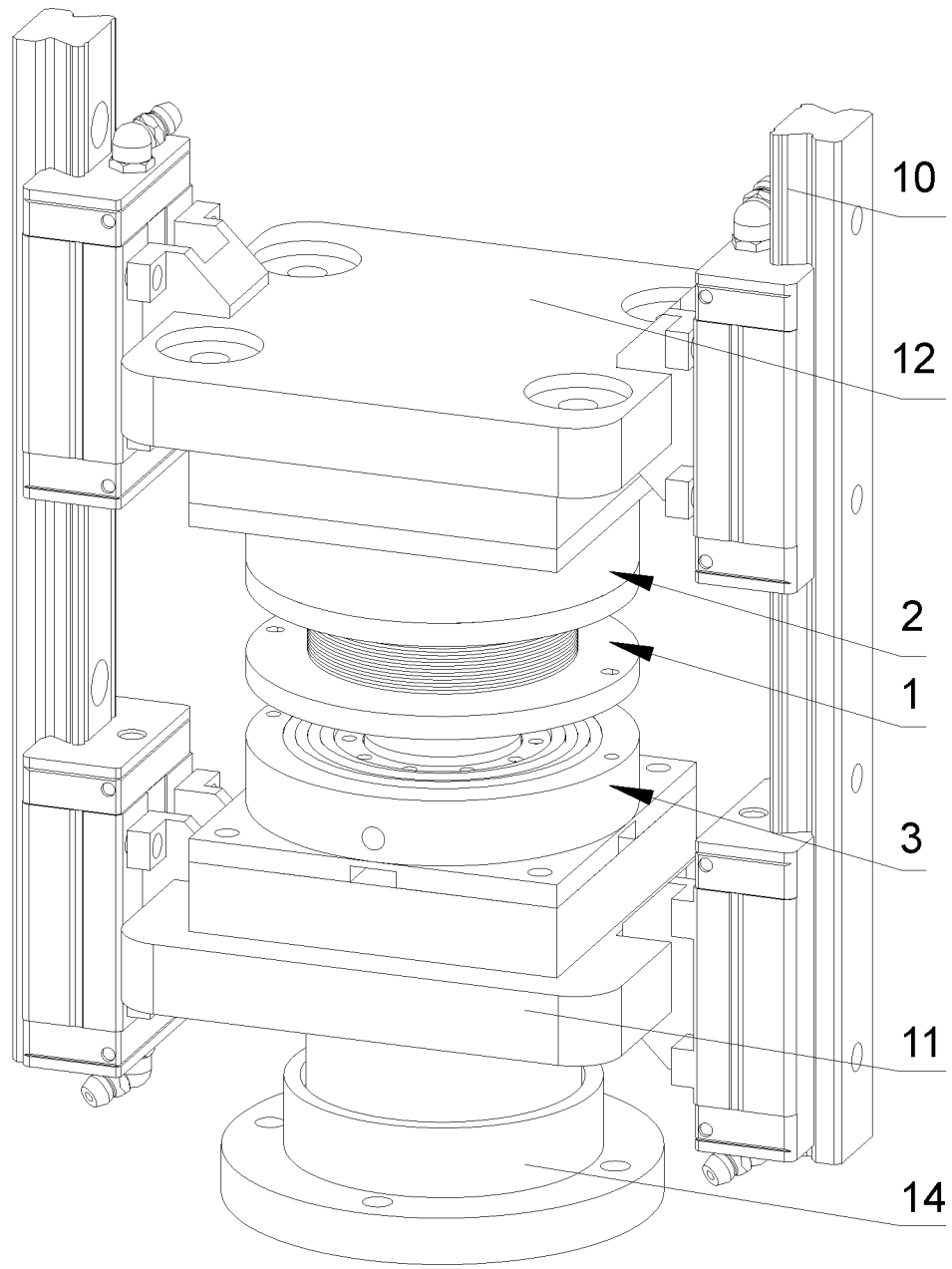
FIG. 1 is a schematic diagram illustrating a structure of a pressure sintering mechanism with a controllable atmosphere according to some embodiments of the present disclosure.

In order to more clearly explain the technical scheme of the embodiment of the present disclosure, the accompanying drawings required in the description of the embodiment may be briefly introduced below. Obviously, the drawings described below are only some examples or embodiments of the present disclosure. Those having ordinary skills in the art, without further creative efforts, may apply the present disclosure to other similar scenarios according to these drawings. Unless obviously obtained from the context or the context illustrates otherwise, the same numeral in the drawings refers to the same structure or operation.

It should be understood that the terms "system", "device", "unit" and/or "module" as used herein are used as a method for distinguishing different components, elements, parts, sections, or assemblies at different levels. However, if other words serve the same purpose, the words may be replaced by other expressions.

As shown in the present disclosure and claims, the words "one", "a", "a kind" and/or "the" are not especially singular but may include the plural unless the context expressly suggests otherwise. In general, the terms "comprise," "comprises," "comprising," "include," "includes," and/or "including," merely prompt to include operations and elements that have been clearly identified, and these operations and elements do not constitute an exclusive listing. The methods or devices may also include other operations or elements.

The flowcharts used in the present disclosure illustrate operations that systems implement according to some embodiments of the present disclosure. It should be understood that the previous or subsequent operations may not be accurately implemented in order. Instead, each step may be processed in reverse order or simultaneously. Meanwhile, other operations may also be added to these processes, or a certain step or several steps may be removed from these processes.

Figure 2:
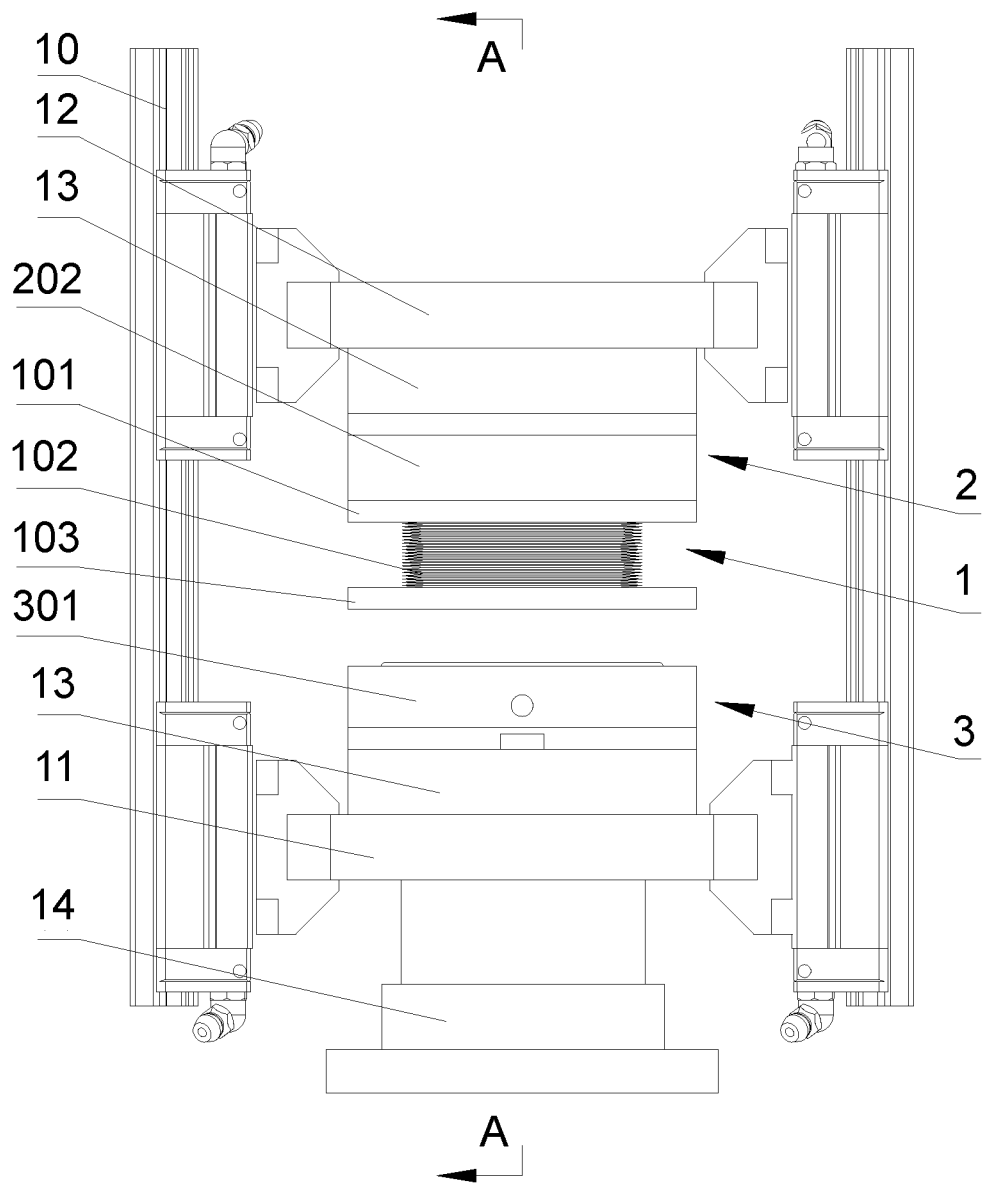
FIG. 2 is a diagram illustrating a main view of a pressure sintering mechanism with a controllable atmosphere according to some embodiments of the present disclosure.
Figure 3:
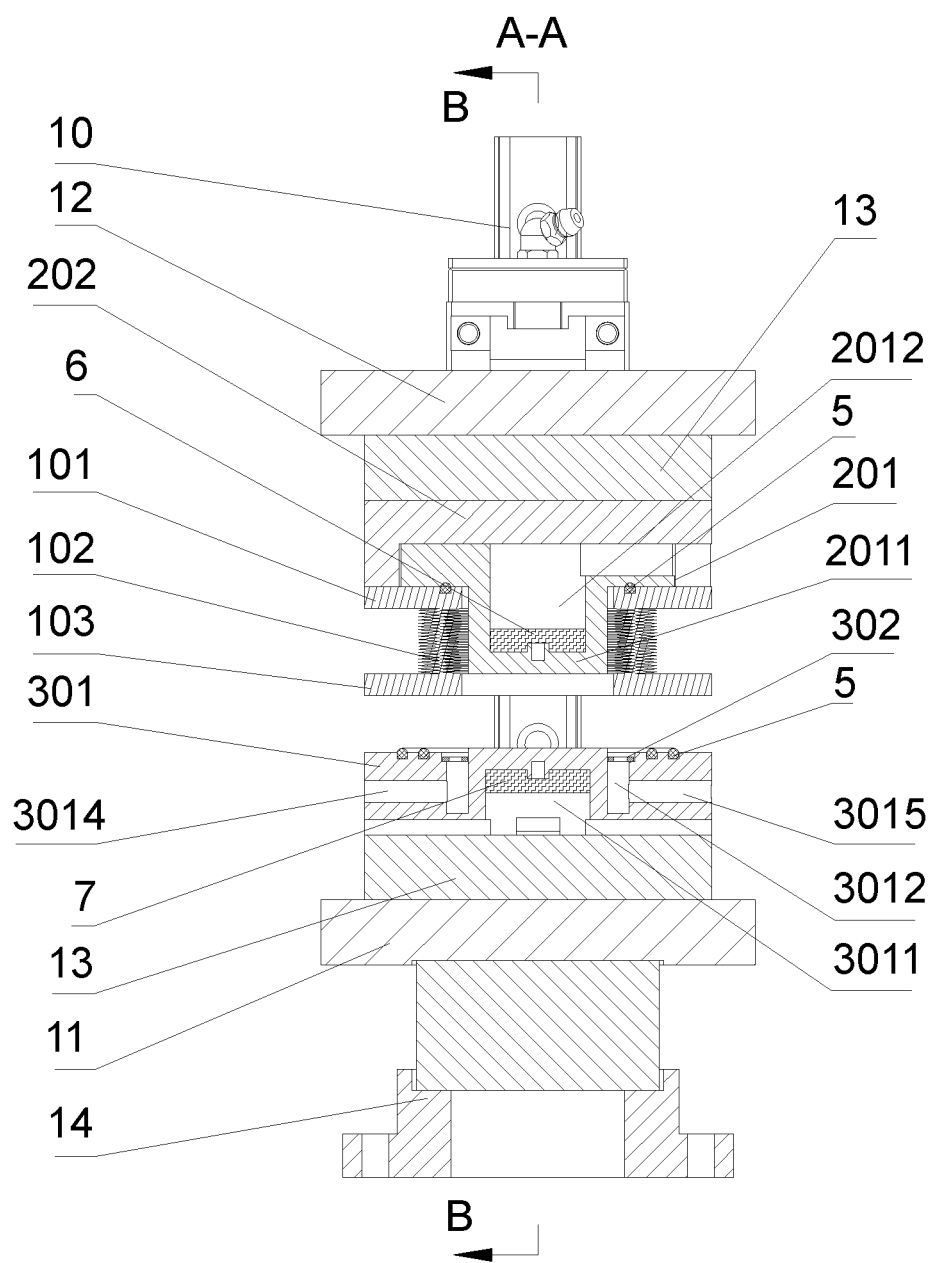
FIG. 3 is a diagram illustrating a cross-sectional view at A-A in FIG. 2.
Figure 4:
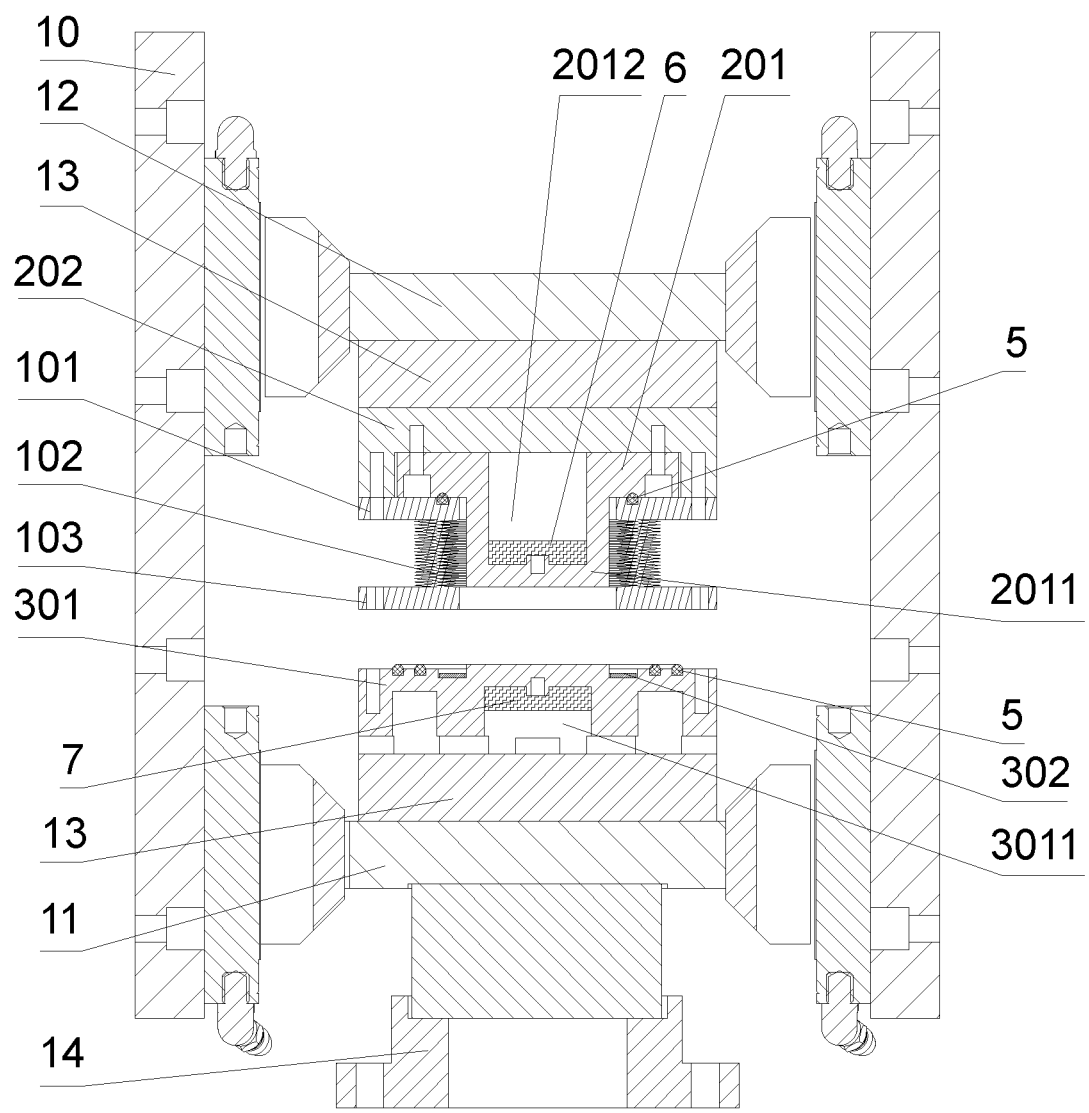
FIG. 4 is a diagram illustrating a cross-sectional view at B-B in FIG. 3.
Figure 5:
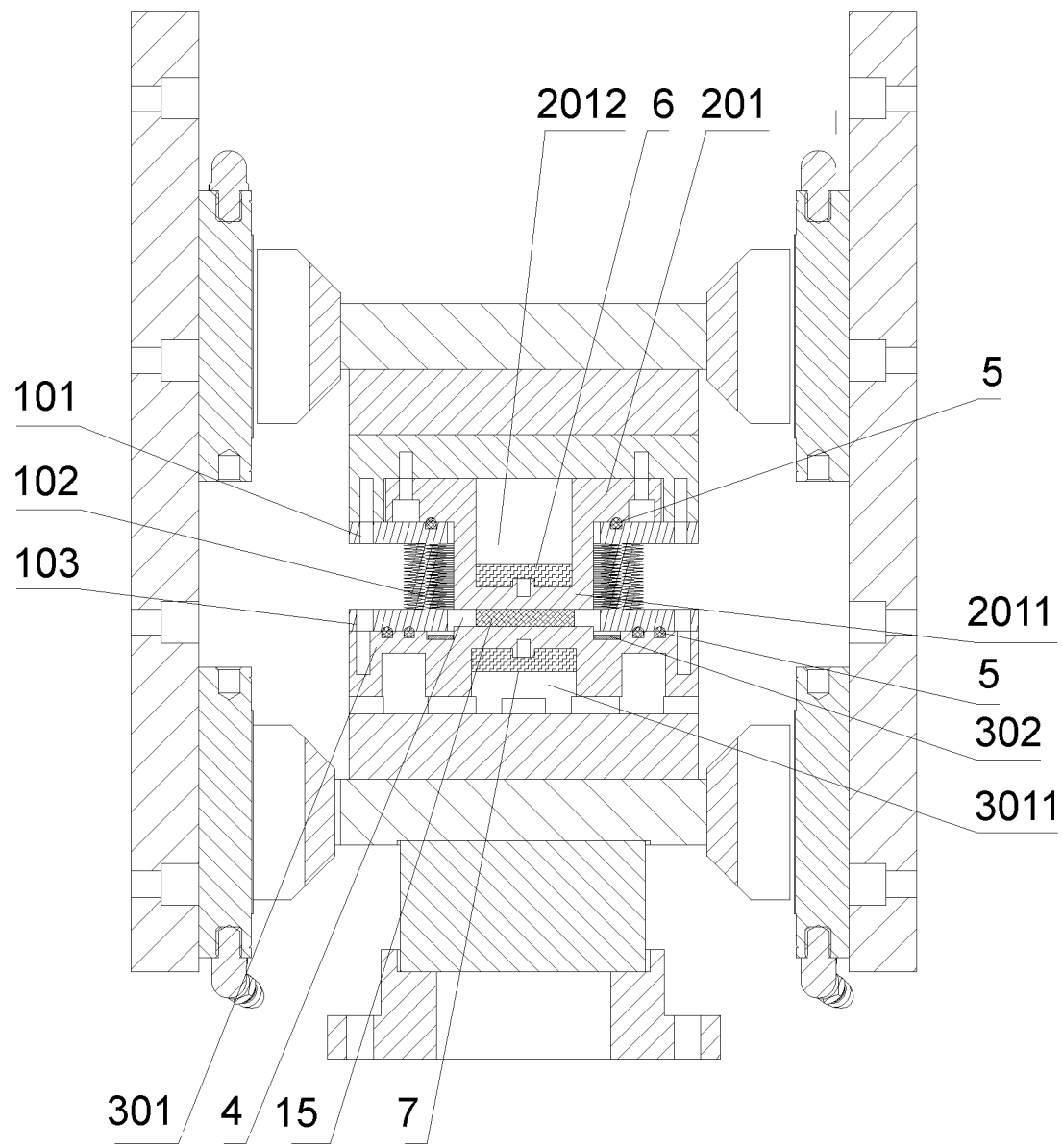
FIG. 5 is a schematic diagram illustrating a structure for forming a sintering chamber according to some embodiments of the present disclosure.

FIG. 1 is a schematic diagram illustrating a structure of a pressure sintering mechanism with a controllable atmosphere according to some embodiments of the present disclosure. FIG. 2 is a diagram illustrating a main view of a pressure sintering mechanism with a controllable atmosphere according to some embodiments of the present disclosure. FIG. 3 is a diagram illustrating a cross-sectional view at A-A in FIG. 2. FIG. 4 is a diagram illustrating a cross-sectional view at B-B in FIG. 3. FIG. 5 is a schematic diagram illustrating a structure for forming a sintering chamber according to some embodiments of the present disclosure.

As shown in FIG. 1, some embodiments of the present disclosure provide a pressure sintering mechanism with a controllable atmosphere including a telescopic tube 1, two pressure components arranged opposite to each other, and a heating component.

The telescopic tube 1 refers to a tubular structure with at least a part being elastically telescopic. As shown in FIG. 2, the telescopic tube 1 is at least partially an elastically telescopic bellows section 102.

Being elastically telescopic refers to a feature that an object may be deformed under an external force and may be completely recovered to an original state when the external force is removed.

The bellows section 102 is a tubular elastic sensitive element connected with foldable wrinkled sheets along a folded and expanded direction.

In some embodiments, a material of the telescopic tube 1 is unlimited, including but not limited to a metal material, etc. For example, the material of the telescopic tube 1 may be carbon steel, stainless steel, etc.

As shown in FIGS. 2-5, two ends of the telescopic tube 1 are a fixed end 101 and a free end 103, respectively.

The fixed end 101 is an end of the telescopic tube 1 fixedly connected to the pressure component. In some embodiments, one of the pressure components is fixedly sealed and connected to the fixed end of the telescopic tube 1 to seal an opening of the fixed end 101 of the telescopic tube 1.

A fixed connection refers to a connection in which a part or component is fixed without any relative movement. The fixed connection may include a removable connection (e.g., a threaded connection, a snap connection, etc.) and a non-removable connection (e.g., a bonded connection, a welded connection, etc.).

Understandably, the sealed and fixed connection is to further implement a sealing function based on the fixed connection. In some embodiments, the sealed and fixed connection may be implemented directly based on the fixed connection. For example, the fixed end 101 of the telescopic tube 1 may be in the sealed and fixed connection with one of the pressure components based on the bonded connection, the welded connection, etc. In some embodiments, the sealed and fixed connection may also be implemented based on a combination of the fixed connection and a sealing component. For example, the fixed connection between the fixed end 101 of the telescopic tube 1 and one of the pressure components may be implemented first based on the threaded connection, the welded connection, etc., and then the sealed and fixed connection may be implemented by arranging a sealing component (e.g., a sealing ring, etc.).

The free end 103 is the other end of the telescopic tube 1 used to contact a lower pressure component. The free end 103 may be relative to the fixed end 101, and the free end 103 may be not fixedly connected to other components. In some embodiments, the free end 103 may be arranged to be removably connected to other components. In some embodiments, the other one of the pressure components is arranged opposite to an opening of the free end 103 of the telescopic tube 1.

In some embodiments, the fixed end 101 and the free end 103 may be of a flange ring structure. A central hole enclosed by an inner peripheral wall of the flange ring structure is connected to a tube hole of the telescopic tube 1. An intersection between an upper surface of the fixed end 101 and the central hole is a tube hole of the fixed end 101, and an intersection between a lower surface of the free end 103 and the central hole is a tube hole of the free end 103. The telescopic tube 1 may be considered as a bellows tube when the bellows section 102 occupies the telescopic tube 1 except for the flange ring structure at the two ends. In some embodiments, the fixed end 101 and the free end 103 may also be of any other structure, such as a square flat structure with a central hole, etc.

In some embodiments of the present disclosure, a static sealing structure of the fixed end of the telescopic tube may be formed through the sealed and fixed connection between the one of the pressure components and the fixed end of the telescopic tube, thereby reducing sealing difficulty and improving a sealing effect. The other one is arranged opposite to the free end of the telescopic tube, which facilitates the pick and place of a product to be sintered and bonded.

The pressure component is a component configured to apply pressure to a product 15 inside a sintering chamber 4. As shown in FIG. 5, the telescopic tube 1 is arranged between the two pressure components and configured to seal an opening of an end of the telescopic tube 1 when the two pressure components are close to each other to form a sealed sintering chamber 4 inside the telescopic tube 1 and to apply pressure to the product 15 (e.g., a chip and a substrate) inside the sintering chamber 4.

The sintering chamber 4 refers to a sealed chamber configured to maintain the product 15 to be sintered and bonded in a controllable atmosphere. In some embodiments, the two pressure components and the telescopic tube 1 cooperate with each other to form a flexible sealed sintering chamber.

A specific layout of the two pressure components is not limited. In some embodiments, the two pressure components may be horizontally distributed in a left-right direction, i.e., in a horizontal structure. For the convenience of placing the product 15 to be sintered and bonded between the two pressure components, it is necessary to arrange a loading structure for loading the product 15 on the two pressure components or to place the product 15 to be sintered and bonded directly inside the telescopic tube 1 to achieve loading.

In some embodiments, the two pressure components may be distributed vertically in an up-and-down direction, i.e., a vertical structure. As shown in FIGS. 1-2, the two pressure components are an upper pressure component 2 and a lower pressure component 3, respectively. The upper pressure component 2 is located above the lower pressure component 3, thereby enabling the lower pressure component 3 to load the product 15 in a bracketed manner.

In some embodiments, one of two pressure components is in the sealed and fixed connection with the fixed end 101 of the telescopic tube 1 to seal the opening of the fixed end 101 of the telescopic tube 1. The other one is arranged opposite to the opening of the free end 103 of the telescopic tube 1. It is understood that the telescopic tube 1 may be fixedly connected to both the upper pressure component 2 and the lower pressure component 3.

It should be noted that in order to prevent interference between operator's hands or transmitting manipulators and the telescopic tube 1 when picking and placing the product 15 on the lower pressure component 3, the fixed end 101 of the telescopic tube 1 is fixedly connected to the upper pressure component 2 in some embodiments of the present disclosure, which improves operation convenience.

In some embodiments, one of the pressure components is in the sealed and fixed connection with the fixed end 101 of the telescopic tube 1, which may be that the fixed end 101 of the telescopic tube 1 is fixedly connected to the upper pressure component 2, and the sealing ring 5 is arranged therein. The sealing ring 5 is an element with the sealing function, including but not limited to a fluoroelastomer sealing ring, a PTFE sealing ring, etc.

Figure 6:
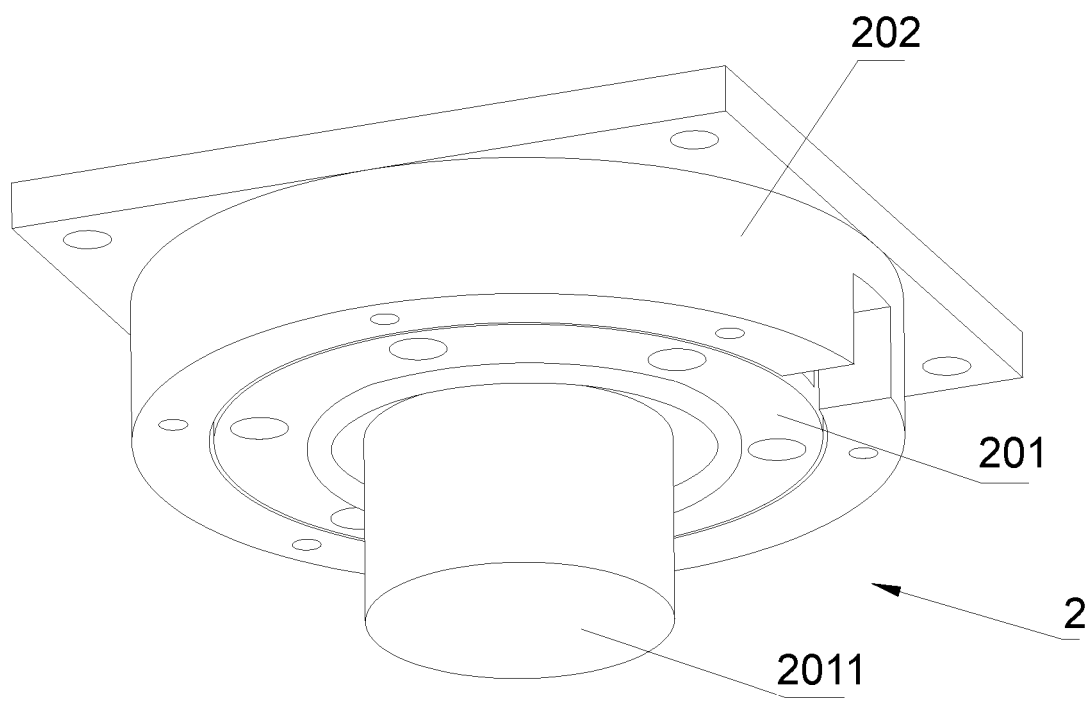
FIG. 6 is a schematic diagram illustrating a structure of an upper pressure component according to some embodiments of the present disclosure.
Figure 7:
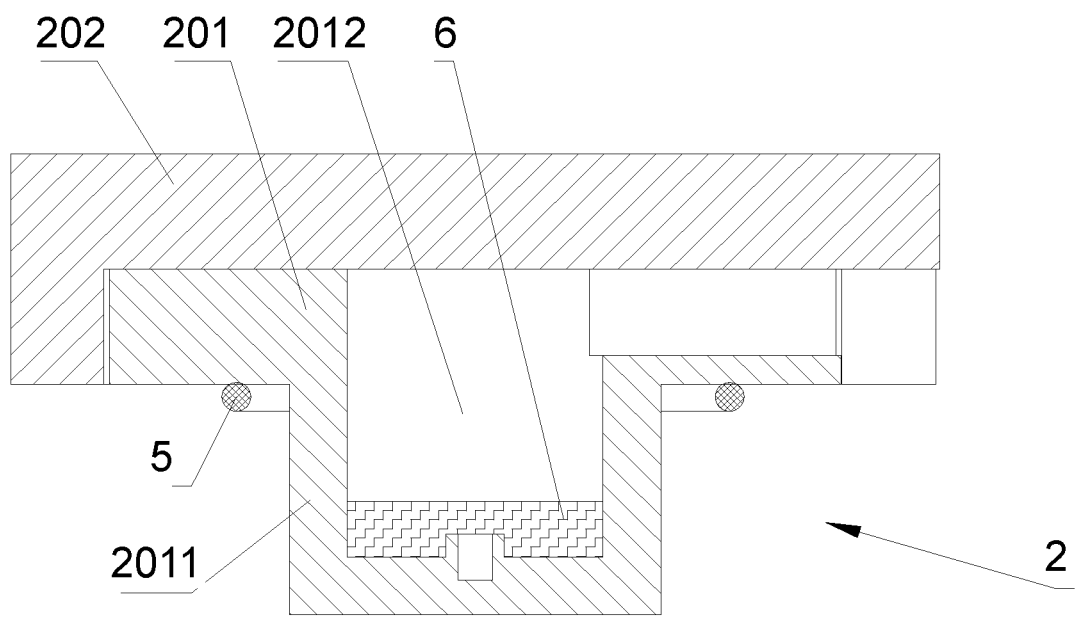
FIG. 7 is a diagram illustrating a cross-sectional view of an upper pressure component according to some embodiments of the present disclosure.

More descriptions regarding the upper pressure component may be found in FIGS. 6-7 and related descriptions thereof. More descriptions regarding the lower pressure component may be found in FIGS. 8-10 and related descriptions thereof.

In some embodiments of the present disclosure, by designing the two pressure components in an up-and-down layout, the lower pressure component may load a product in the bracketed manner. Compared to designing the two pressure components in a left-right layout, the up-and-down layout (i.e., the vertical structure) does not require an additional loading structure, which can improve compactness of the structure. Moreover, since the telescopic tube is fixedly connected to the upper pressure component, making less interference with the telescopic tube when picking or placing the product, thus improving the operation convenience.

The heating component is a component that may radiate heat to implement a heating function. As shown in FIG. 5, the heating component may be configured to heat the product 15 in the sintering chamber 4, which enables sintering the product 15.

The heating component may include a plurality of heating elements, such as two heating elements, three heating elements, etc. In some embodiments, the heating component may include an upper heating element 6 and a lower heating element 7. In some embodiments, the heating element may be an electric heating element, including but not limited to an electric heating coil, an electric heating pad, etc.

More descriptions regarding the heating component may be found in FIGS. 6-10 and related descriptions thereof.

In some embodiments, the controllable atmosphere may be realized by using the telescopic tube 1 in conjunction with the two pressure components to form a flexible sealed sintering chamber. Since the telescopic tube 1 has the elastically telescopic bellows section 102, an elasticity modulus of the telescopic tube 1 is very low. In case of a small pressure operating range, the telescopic tube 1 may form the sintering chamber 4 with smaller pressure for sealing. As the pressure component continues to apply pressure, pressure on the telescopic tube 1 is much less than pressure on the product (e.g., the chip and the substrate) under an influence of an elastically telescoping feature of the telescopic tube 1. So it may be considered that all the pressure on the pressure component is applied to the product. Thus the pressure on the product 15 may be known by measuring the pressure on the pressure component, thereby enabling sintering and bonding in the small pressure operating range. The manner for measuring the pressure is easy to operate and has wide applicability and practicality.

FIG. 6 is a schematic diagram illustrating a structure of an upper pressure component according to some embodiments of the present disclosure. FIG. 7 is a diagram illustrating a cross-sectional view of an upper pressure component according to some embodiments of the present disclosure.

As shown in FIGS. 6-7, the upper pressure component 2 may include an upper pressure head 201 with an extension portion 2011 protruding downwardly from a lower surface, and the extension portion 2011 extends into the telescopic tube 1.

The upper pressure head 201 is a structure in the upper pressure component 2 that is configured to extrude the product 15. In some embodiments, the upper heating element 6 is arranged on the upper pressure head 201.

The extension portion 2011 is a portion of the lower surface of the upper pressure head 201 that protrudes downwardly. In some embodiments, a shape of an outer contour line of a cross-section of the extension portion 2011 may be determined based on a shape of an inner contour line of a cross-section of the telescopic tube 1. For example, the shape of the outer contour line of the cross-section of the extension portion 2011 may be circular, square, oval, etc.

In some embodiments of the present disclosure, the telescopic tube may have a longer length by using a design of the extension portion so that a bellows section may also have a longer length, and the telescopic tube may have a larger compression. Accordingly, a distance between a sealing ring at a fixed end and the upper heating element is extended to prevent the sealing ring here from becoming too hot. Moreover, the extension portion is located in the bellows section, and heat on the extension portion is uneasy to be dissipated, thus improving a heating effect. In addition, the extension portion also has a positioning function, which prevents the telescopic tube from being skewed to a greater extent.

As shown in FIG. 7, the upper heating chamber 2012 is arranged downwardly on an upper surface of the upper pressure head 201, a bottom end of the upper heating chamber 2012 is located in the extension portion 2011, and the upper heating element 6 is arranged in the bottom end of the upper heating chamber 2012.

The upper heating chamber 2012 is a chamber for holding the upper heating element 6. In some embodiments, a structure and a size of the upper heating chamber 2012 may be determined based on the upper heating element 6. For example, when the upper heating element 6 is an electric heating coil, the upper heating chamber 2012 is a cylindrical chamber whose diameter is the same as or slightly larger than a diameter of the electric heating coil.

In some embodiments of the present disclosure, based on the upper heating chamber being arranged downwardly on the upper surface of the upper pressure head, the bottom end of the upper heating chamber is located in the extension portion, and the upper heating element is arranged in the bottom end of the upper heating chamber, which does not only make an installation of the upper heating element more convenient but also significantly reduce a distance between the upper heating element and the lower surface of the extension portion, thereby improving the heating effect.

As shown in FIGS. 6-7, the upper pressure component 2 further includes an upper pressure head base 202 located above the upper pressure head 201.

The upper pressure head base 202 is a structure in the upper pressure component 2 that fixes the upper pressure head 201. In some embodiments, the upper pressure head base 202 is fixedly connected to the upper pressure head 201 and seals an upper end opening of the upper heating chamber 2012, and the fixed end 101 of the telescopic tube 1 is fixedly connected to the upper pressure head base 202 or the upper pressure head 201.

In some embodiments, the sealing ring 5 (e.g., a fluoroelastomer sealing ring, etc.) is arranged between the fixed end 101 of the telescopic tube 1 and the lower surface of the upper pressure head 201. The fixed end 101 of the telescopic tube 1 has a flange hole, and a screw passes through the flange hole and is threadedly connected to the upper pressure head base 202 or the upper pressure head 201. The sealing ring 5 is then compressed and deformed by the fixed end 101 of the telescopic tube 1 and the lower surface of the upper pressure head 201 to achieve sealing on the upper side. It should be noted that the fixed end 101 of the telescopic tube 1 may also be arranged with an external thread and the upper pressure head base 202 with an internal thread, so that the telescopic tube 1 may be fixed directly to the upper pressure head base 202 by thread tightening. In addition, the fixed end 101 of the telescopic tube 1 may also be fixedly connected to the upper pressure head base 202 by riveting, welding, etc.

Figure 8:
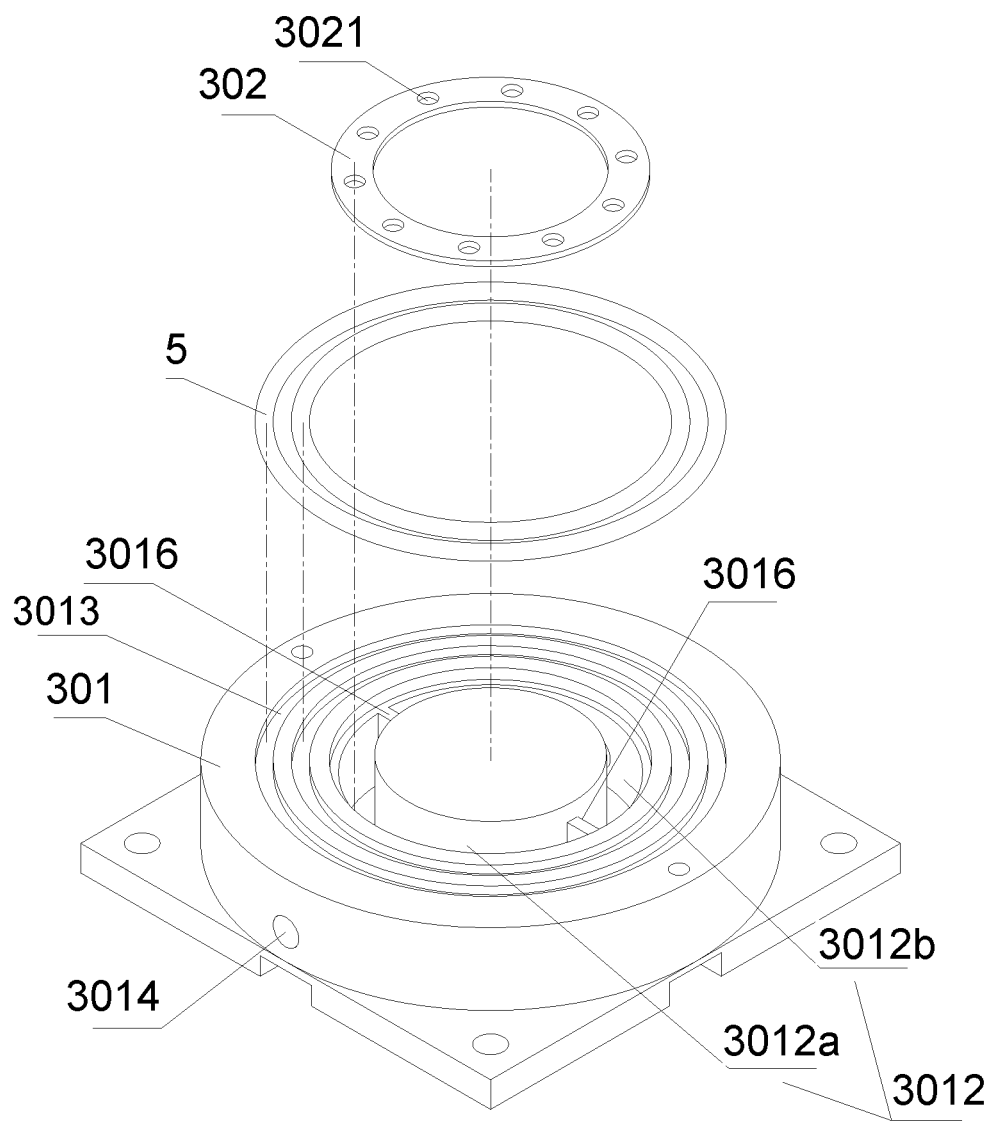
FIG. 8 is an exploded schematic diagram illustrating a lower pressure component according to some embodiments of the present disclosure.
Figure 9:
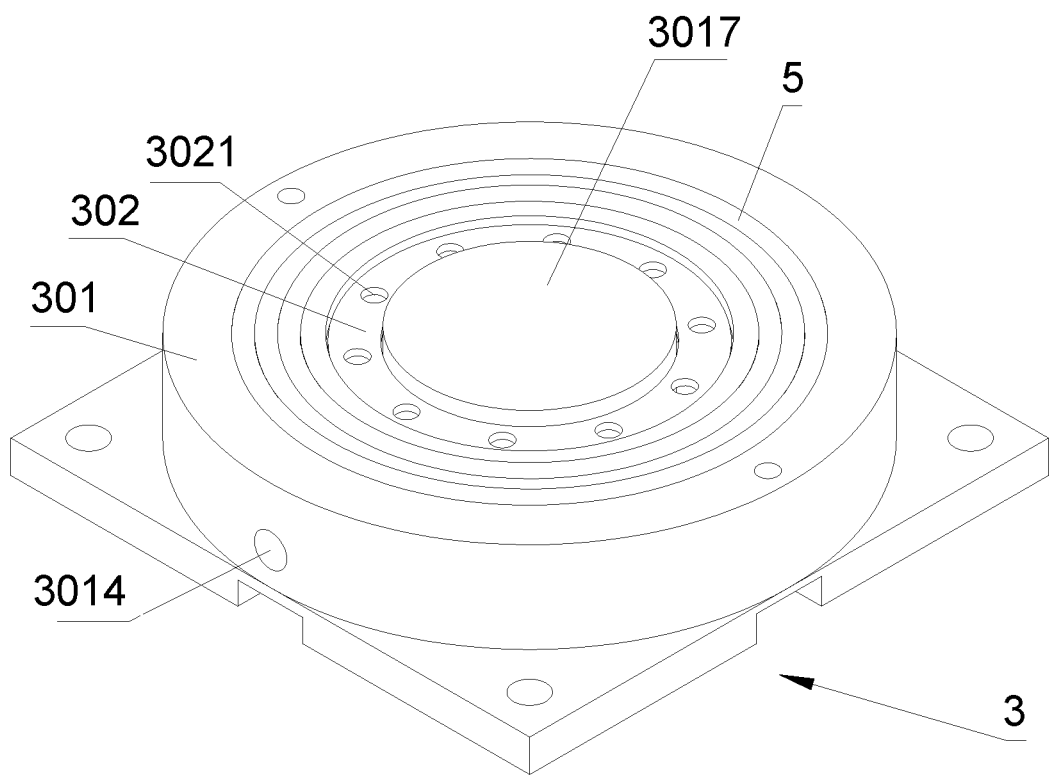
FIG. 9 is a schematic diagram illustrating a structure of a lower pressure component according to some embodiments of the present disclosure.
Figure 10:
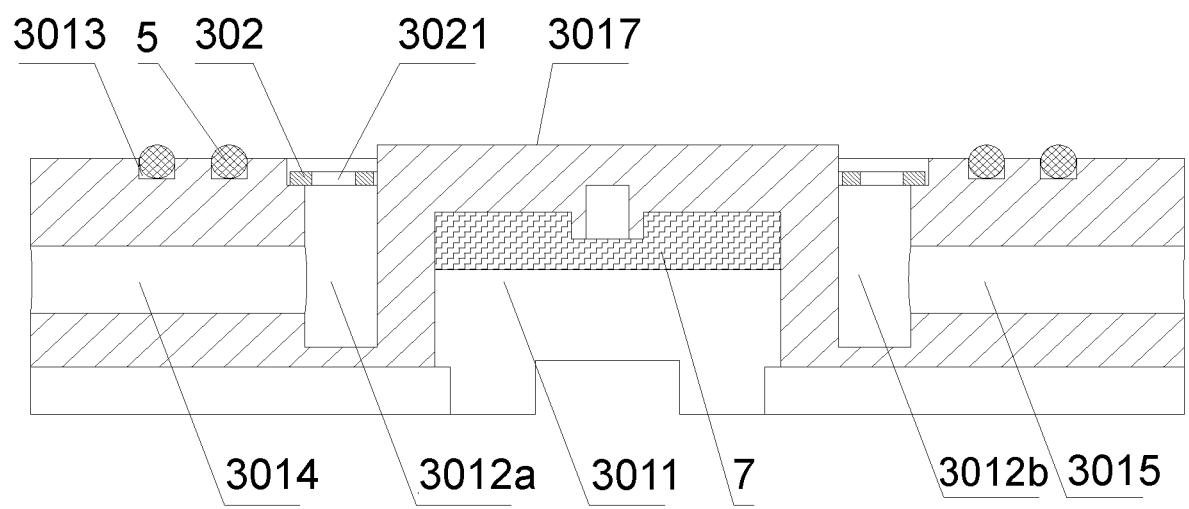
FIG. 10 is a diagram illustrating a cross-sectional view of a lower pressure component according to some embodiments of the present disclosure.

FIG. 8 is an exploded schematic diagram illustrating a lower pressure component according to some embodiments of the present disclosure. FIG. 9 is a schematic diagram illustrating a structure of the lower pressure component according to some embodiments of the present disclosure. FIG. 10 is a diagram illustrating a cross-sectional view of a lower pressure component according to some embodiments of the present disclosure.

As shown in FIG. 2 and FIG. 9, the lower pressure component 3 may include a lower pressure head 301.

The lower pressure head 301 is a structure in the lower pressure component 3 that is configured to apply pressure on the product 15. As shown in FIGS. 8-10, the lower pressure head 301 has a lower heating chamber 3011 and an insulating venting slot 3012 surrounding the outside of the lower heating chamber 3011. The lower heating chamber 3011 has an opening facing downward, and the lower heating element 7 arranged on the top of the lower heating chamber 3011. The insulating venting slot 3012 has an opening facing upward. When the telescopic tube 1 forms the sintering chamber 4, the insulating venting slot 3012 is connected to the sintering chamber 4.

The lower heating chamber 3011 is a chamber configured to hold the lower heating element 7. A structure and a size of the lower heating chamber 3011 may be determined based on the lower heating element 7. In some embodiments, the structure and the size of the lower heating chamber 3011 may be the same as or different from a structure and a size of the upper heating chamber 2012, which is not limited in the present disclosure.

As shown in FIG. 8 and FIG. 10, an upper surface of the lower pressure head 301 or the free end 103 of the telescopic tube 1 is arranged with an annular slot 3013. The annular slot 3013 is embedded with the sealing ring 5 (e.g., a fluoroelastomer sealing ring, etc.), and a count of sealing rings 5 on the upper surface of the lower pressure head 301 may vary depending on a specific situation. In order to enhance sealing performance, the count of sealing rings 5 may be increased.

The insulating venting slot 3012 is an annular slot for ventilation and insulation. In some embodiments, the insulating venting slot 3012 is located on an inner side of the sealing ring 5 to reduce heat transmitted from the sintering chamber 4 to the sealing ring 5 and to improve a service life of the sealing ring 5.

In some embodiments, sealing on a lower side is achieved when the free end 103 of the telescopic tube 1 resists against the sealing ring 5 on the upper surface of the lower pressure head 301, at this time, the sintering chamber 4 is formed between the upper pressure head 201, the telescopic tube 1, and the lower pressure head 301.

As shown in FIG. 10, the lower pressure head 301 has a projection portion 3017 protruding upwardly corresponding to an upper surface of the lower heating chamber 3011, and the insulating venting slot 3012 is located on an outer side of the projection portion 3017.

The projection portion 3017 is a portion of the upper surface of the lower pressure head 301 that protrudes upward. In some embodiments, a shape of the outer contour line of a cross-section of the projection portion 3017 is not limited, which may be circular, square, oval, etc. In some embodiments, a structure and a size of the projection portion 3017 may be the same as or different from a structure and a size of the extension portion 2011, which is not limited in the present disclosure.

In some embodiments, since an upper surface of the projection portion 3017 is a working surface on which the product 15 is placed, a surface of the processed lower pressure head 301 needs to be hardened (e.g., hard chrome plated, etc.) first, and then the upper surface of the projection portion 3017 is leveled (e.g., polished, etc.) to ensure hardness and flatness of the working surface. Therefore, the projection portion 3017 may be more convenient for polishing.

As shown in FIG. 5, an outer wall of the lower pressure head 301 is arranged with an air inlet 3014 and an air outlet 3015. The air inlet 3014 and the air outlet 3015 are both connected to the insulating venting slot 3012. Designing the insulating venting slot 3012 not only provides access for the air inlet and air outlet but also implements an insulation function to avoid damaging the sealing ring 5 of the lower pressure head 301 due to high temperature.

As shown in FIG. 8, two partitions 3016 are arranged in the insulating venting slot 3012, and the insulating venting slot 3012 is separated by the two partitions 3016 to form an air inlet slot 3012*a* and an air outlet slot 3012*b*.

The partitions 3016 refer to a structure configured to separate the insulating venting slot 3012. In some embodiments, the partitions 3016 may be integrally molded with the lower pressure head 301 or may be fixedly connected to the insulating venting slot 3012 based on manners of welding, clamping, etc., to separate the insulating venting slot 3012 into the air inlet slot 3012*a* and the air outlet slot 3012*b*.

In some embodiments, the air inlet 3014 is connected to the air inlet slot 3012*a*, and the air outlet 3015 is connected to the air outlet slot 3012*b*, enabling a process air entering the air inlet 3014 to pass through the air inlet slot 3012*a*, the sintering chamber 4, and the air outlet slot 3012*b* in sequence before finally flow out of the air outlet 3015, thereby ensuring that the sintering chamber 4 develops a preset inert atmosphere.

As shown in FIGS. 8-10, an upper end opening of the insulating venting slot 3012 is covered with a rectification plate 302. A plurality of through holes 3021 downwardly run through the rectification plate 302 from an upper surface. And the plurality of through holes 3021 are evenly distributed circumferentially along the insulating venting slot 3012 and are connected to the insulating venting slot 3012. The rectification plate 302 is a structure with the plurality of through holes 3021 distributed circumferentially along the insulating venting slot 3012 arranged at the upper end opening of the insulating venting slot 3012. Designing the rectification plate 302 may improve uniformity of air flowing to the sintering chamber 4.

In some embodiments, the lower pressure component 3 may be supported by a frame 8 or placed directly on a workbench, and the upper pressure component 2 is connected to an output end of a drive device 9. When the pressure sintering mechanism with the controllable atmosphere operates, the product 15 to be sintered and bonded (e.g., a chip and a substrate) is placed on the upper surface of the lower pressure head 301. Then the drive device 9 drives the upper pressure head 201 to move downward so that the free end 103 of the telescopic tube 1 contacts the upper surface of the lower pressure head 301, and the sealing ring 5 is compressed to form the sintering chamber 4. The drive device 9 drives the upper pressure head 201 to continue to move downward and the bellows section 102 of the telescopic tube 1 is compressed until the upper pressure head 201 is pressurized in contact with the product 15. Next, a vacuum pump is configured to evacuate the sintering chamber 4, and subsequently, an inert air (e.g., argon, etc.) is introduced into the sintering chamber 4 to form the inert atmosphere. Finally, a required atmosphere is introduced for pressurized sintering according to a process requirement, during which the upper heating element 6 and the lower heating element 7 may be turned on accordingly for heating according to the process requirement.

In some embodiments, by designing the telescopic tube 1 which has a very low elasticity modulus with the bellows section 102, for a small pressure working range (e.g., a range with pressure less than 100 kg), pressure (e.g., pressure of 0.5-1 kg) on sealing the telescopic tube 1 is much less than pressure on the product 15, it may be considered that a reading of a pressure sensor 14 is the pressure on the product 15. Therefore, the pressure on the product 15 may be obtained by measuring the pressure of the pressure component, satisfying the small pressure working range for a sintering and bonding process. The pressure of the pressure component may be obtained by the pressure sensor arranged on the upper pressure component 2 or the lower pressure component 3.

Figure 11:
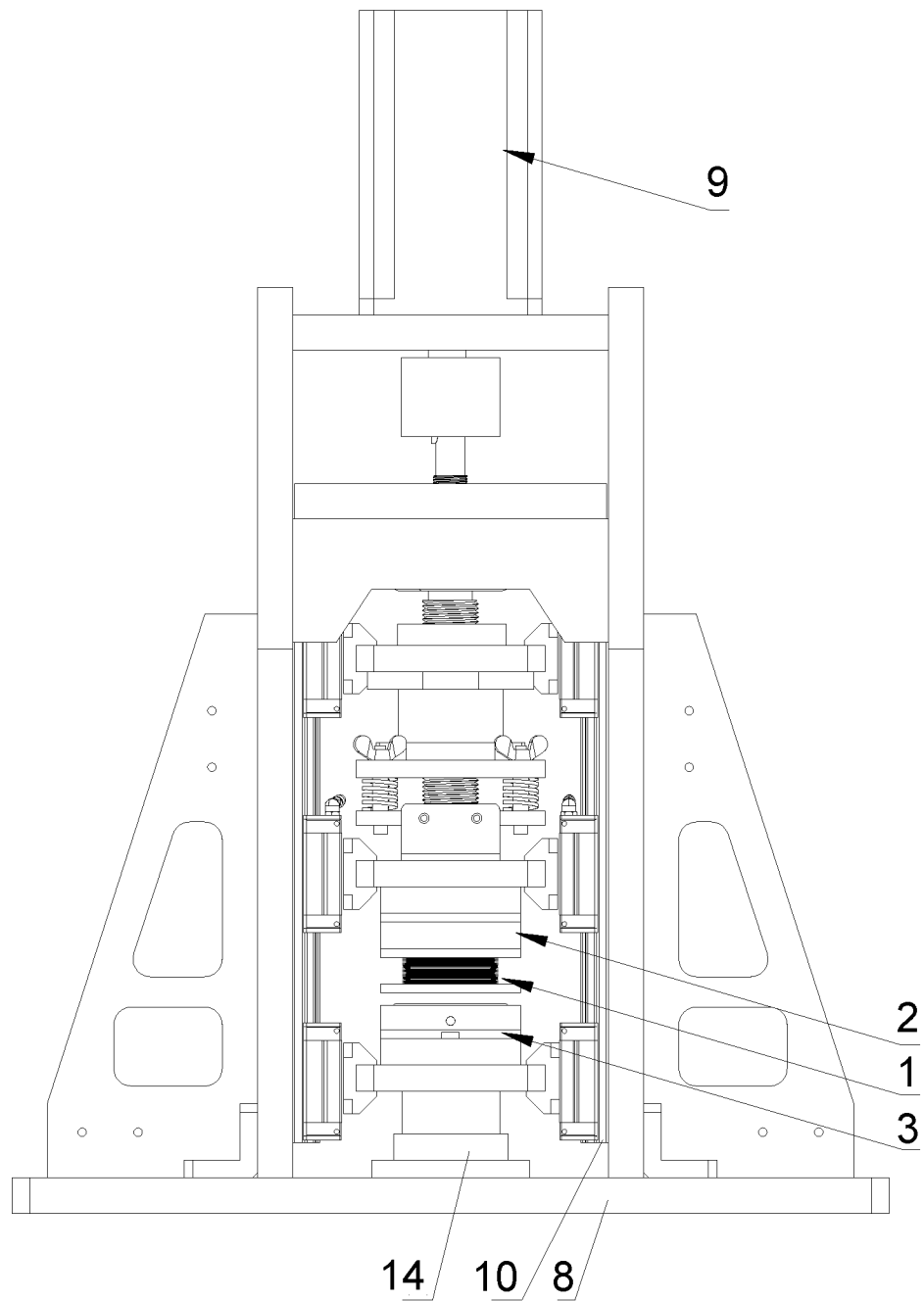
FIG. 11 is a schematic diagram illustrating a structure of a sintering device according to some embodiments of the present disclosure.

More descriptions regarding the frame and the drive device may be found in FIG. 11 and related description thereof.

In some embodiments, the pressure sintering mechanism with the controllable atmosphere may also include a temperature sensor (which is not shown).

In some embodiments, the temperature sensor may be arranged at any location of the pressure component (including the upper pressure component and the lower pressure component) near the sealing ring 5 for monitoring the temperature of the sealing ring 5.

It may be understood that, due to a special feature of a material of the sealing ring 5, the sealing ring 5 may be damaged when the temperature is too high, which affects sealing performance of the sealing ring 5 and then affects sealing performance of the sintering chamber 4, thereby leading to a decrease in product quality. Therefore, it is necessary to monitor the temperature of the sealing ring 5.

In some embodiments, the pressure sintering mechanism with the controllable atmosphere may also include a control device (which is not shown).

The control device is a device that is capable of communicating with other components of the pressure sintering mechanism and processing data and/or information.

For example, the control device may be a programmable controller, a programmable regulator, etc.

In some embodiments, the control device may be in a communicative connection with other components (e.g., a heating component, etc.) of the pressure sintering mechanism and the temperature sensor. For example, the control device may obtain temperature monitoring data from a temperature sensor. As another example, the control device may send a heating control instruction to the heating component, etc.

The communicative connection is a connection manner that constitutes communication between devices or components through the transmission and interaction of signals. The communicative connection may include a wired communication connection (e.g., Ethernet, USB, TCP/IP, and other protocols) and a wireless communication connection (e.g., WIFI, Bluetooth, etc.).

In some embodiments, the control device may include a processor for processing the data and/or information.

In some embodiments, the processor may obtain the temperature monitoring data based on the temperature sensor and issue a pre-warning message in response to the temperature monitoring data not meeting a first preset condition.

The temperature monitoring data is temperature data near the sealing ring obtained by the temperature sensor. In some embodiments, the temperature monitoring data may be obtained based on the temperature sensor or any other feasible means.

The first preset condition is a preset condition for pre-warning discrimination based on the temperature monitoring data. For example, the first preset condition may include that the temperature monitoring data does not exceed a temperature threshold, etc. The temperature threshold may be an empirical value, an experimental value, a simulated value, etc.

The pre-warning message is a relevant message used to alert and warn a user in advance. For example, the pre-warning message may be a warning sound (e.g., a siren sound), a warning signal light (e.g., red light flashing), a warning text, etc.

In some embodiments, the warning message may include a sealing ring maintenance warning message and a sealing ring replacement warning message. The sealing ring maintenance warning message refers to a relevant message used to remind and warn the user in advance to repair the sealing ring. The sealing ring replacement warning message is used to remind and warn the user in advance to replace the sealing ring.

In some embodiments, the control device may be in the communicative connection with a user terminal, send the pre-warning message to the user terminal, and issue the pre-warning message based on the user terminal.

The user terminal refers to a device configured to interact with the user. For example, the user terminal may include a smartphone, a smart bracelet, a tablet computer, etc.

In some embodiments, the processor may compare the temperature monitoring data with the first preset condition to determine whether to issue the pre-warning message. Exemplarily, the warning message is not sent when the temperature monitoring data does not exceed the temperature threshold. When the temperature monitoring data exceeds the temperature threshold, the pre-warning message is issued.

Some embodiments of the present disclosure may remind the user in real-time by sending the pre-warning message through the user terminal so that the user may identify and solve problems in time to reduce a loss cost.

In some embodiments, the processor may also be configured to obtain historical temperature data of a sealing ring, determine a sealing ring loss through a loss prediction model based on the history temperature data of the sealing ring, and determine the pre-warning message based on the sealing ring loss.

The historical temperature data of the sealing ring refers to all temperature data monitored by a temperature sensor when using the sealing ring. In some embodiments, the historical temperature data of the sealing ring may include a recording time point, a temperature, and a duration.

In some embodiments, the historical temperature data of the sealing ring may be represented as a vector, such as a vector $(A_n, B_n, C_n)$. A denotes the recording time point; B denotes the temperature; C denotes the duration, and n is an integer greater than 0.

In some embodiments, the historical temperature data of the sealing ring may be a historical temperature sequence of a sealing ring such as $[(A_1, B_1, C_1), (A_2, B_2, C_2), \ldots, (A_n, B_n, C_n)]$, i.e., each recording time point corresponds to historical temperature data of the sealing ring.

In some embodiments, the processor includes a database from which the processor may directly obtain the historical temperature data of the sealing ring. In some embodiments, the processor may also obtain the historical temperature data of the sealing ring based on other means. For example, the historical temperature data of the sealing ring may be obtained based on an input of the user through the user terminal, etc.

The sealing ring loss may be used to reflect an amount of reduction in a service life of the sealing ring 5. It may be understood that, the service life of the sealing ring 5 is related to the temperature, and at a standard temperature (e.g., 10 years), the service life of the sealing ring 5 may be designed. When the temperature is too high, the service life of the sealing ring 5 decreases significantly, i.e., the sealing ring loss increases.

In some embodiments, the sealing ring loss may be represented based on an amount of change in the sealing performance, an elasticity or resilience performance, etc., of the sealing ring. For example, the sealing ring loss increases when the sealing performance of the sealing ring decreases. As another example, the sealing ring loss increases when the elasticity or resilience performance of the sealing ring decreases.

In some embodiments, the sealing ring loss may be a weighted sum of the amount of change in the sealing performance, the elasticity or resilience performance, etc., of the sealing ring. That is, the sealing ring loss is a sum of each amount of change in the sealing performance, the elasticity or resilience performance, etc., of the sealing ring multiplied by a corresponding weight coefficient. For example, the sealing ring loss $M=X*Q1+Y*Q2$, where X denotes the amount of change in the sealing performance of the sealing ring; Y denotes the amount of change in the elasticity or resilience performance of the sealing ring; and Q denotes the weighting coefficient for sealing ring loss, which may be determined based on experiments, etc.

The loss prediction model is a model used to predict the sealing ring loss. In some embodiments, the loss prediction model of the sealing ring may be a machine learning model. For example, the loss prediction model of the sealing ring may be one or a combination of a deep neural network (DNN) model, a back propagation (BP) neural network model, or a custom model.

In some embodiments, an input of the loss prediction model may include sealing ring information and historical temperature data of the sealing ring, and an output of the loss prediction model may include the sealing ring loss.

Descriptions regarding the historical temperature data of the sealing ring and the sealing ring loss may be found in related descriptions hereinabove.

The sealing ring information is information about the sealing ring. For example, the sealing ring information may include a type, a material, etc., of the sealing ring.

In some embodiments, the loss prediction model may be trained based on a plurality of first training samples by with labels. The first training sample may include sample sealing ring information and sample historical temperature data of a sealing ring, and the label may include an actual amount of change in actual performance of the sealing ring at different monitoring temperatures in historical data. The first training sample may be determined based on the historical data. The label may be determined based on manual labeling, etc.

In some embodiments, the first training sample may be input into an initial loss prediction model, and a parameter of the initial loss prediction model is iterated through training until a trained model satisfies the preset training condition to obtain a trained loss prediction model. The preset training condition may be that a loss function is less than a threshold, converges, or a training iteration reaches a threshold. In some embodiments, an algorithm for iterating a model parameter may include a conventional model training manner such as stochastic gradient descent.

Some embodiments of the present disclosure may improve accuracy of a predicted sealing ring loss by processing the seal information and the historical temperature data of the sealing ring with the trained loss prediction model to determine the sealing ring loss.

In some embodiments, since different atmosphere control parameters have different degrees of affecting the sealing ring loss, an input of the loss prediction model may also include a historical atmosphere control parameter.

The historical atmosphere control parameter refers to all data of the atmosphere introduced into the sealing ring when used. In some embodiments, the historical atmosphere control parameter may include a recording time point, an atmosphere type, and a duration.

In some embodiments, the historical atmosphere control parameter may be represented as a vector, such as a vector $(A_n, D_n, C_n)$. A denotes the recording time point; D denotes the atmosphere type; and C denotes the duration and n is an integer greater than 0.

In some embodiments, the historical atmosphere control parameter may be a historical atmosphere control parameter sequence such as $[(A_1, D_1, C_1), (A_2, D_2, C_2), \ldots, (A_n, D_n, C_n)]$, i.e., one historical atmosphere control parameter corresponds to each recording time point.

In some embodiments, the processor may obtain the historical atmosphere control parameter directly from the database. In some embodiments, the processor may also obtain the historical atmosphere control parameter based on other manners. For example, the historical atmosphere control parameter is obtained based on an input of the user through the user terminal, etc.

In some embodiments, the first training sample may include a sample historical atmosphere control parameter when the input of the loss prediction model includes the historical atmosphere control parameter.

In some embodiments of the present disclosure, using the historical atmosphere control parameter as the input of the loss prediction model enables the loss prediction model to take into account an effect of the atmosphere control parameter (e.g., the atmosphere type) on the sealing ring loss when predicting the sealing ring loss, thereby making a prediction result of the sealing ring loss to be more accurate.

In some embodiments, based on sealing ring loss, the pre-warning message is sent when the sealing ring loss does not meet a second preset condition. The second preset condition is a preset condition for pre-warning discrimination based on the sealing ring loss. For example, the second preset condition may include that the sealing ring loss does not exceed a loss threshold, etc. The loss threshold may be an empirical value, an experimental value, a simulated value, etc.

In some embodiments, the temperature monitoring data is obtained by monitoring a temperature near the sealing ring 5, and when the temperature monitoring data does not meet the first preset condition, the pre-warning message is issued, which may, to a certain extent, avoid damage to the sealing ring 5, reduce maintenance or replacement costs, and also ensure usage performance of the sealing ring. At the same time, based on the historical data (including the historical temperature data of the sealing ring and the historical atmosphere control parameter), the sealing ring loss is predicted by the loss prediction model. When the sealing ring loss does not meet the second preset condition, the pre-warning message is issued, which may enable the user to check or replace the sealing ring 5 in advance to further ensure sealing and reliability of the sealing ring, and then ensure sealing of the sintering chamber to ensure quality of a product.

In some embodiments, the longer the length of the extension portion 2011 in the upper pressure component 2, or the further the insulating venting slot 3012 is from the sealing ring 5, the further the transmission of hot air from the sintering chamber 4 to the sealing ring 5 may be reduced, causing a lower temperature of the sealing ring 5. According to the status mentioned above, a size of the extension portion 2011 may be designed to ensure that the temperature of the sealing ring 5 is within a reasonable range, thus ensuring the service life of the sealing ring 5.

In some embodiments, the processor may be configured to determine a target size of the extension portion 2011 based on the temperature monitoring data, a location and a size of the insulating venting slot 3012 in the historical data, and a temperature of the heating component.

The target size of the extension portion 2011 is a size of the extension portion 2011 that is adapted to products with different needs.

In some embodiments, the extension portion 2011 may be replaced based on products with different needs. Since a height of the product after pressing is different and the temperature of the heating component required for the product is different, a corresponding size of the extension portion 2011 is also different. For example, if the temperature of the heating component required for the product is low, an extension portion 2011 with a shorter length may be selected. At this time, not only may the temperature of the sealing ring 5 be within a reasonable range, but also manufacturing costs and space in a mechanism or a device may be saved.

In some embodiments, there are a plurality of manners in which the processor may determine the target size of the extension portion 2011. For example, the target size of the extension portion may be determined based on vector searching.

In some embodiments, the processor may process the temperature monitoring data, the location and the size of the insulating venting slot 3012 in the historical data, and the temperature of the heating component to determine the target size of the extension portion based on a target size determination model. The target size determination model may be a machine learning model.

In some embodiments, determining the target size of the extension portion 2011 enables the extension portion 2011 to be replaced based on products with different requirements, saving manufacturing costs and space in the mechanism or the device while ensuring that the temperature of the sealing ring 5 is within the reasonable range.

In some embodiments, the processor may also be configured to determine a target material of the sealing ring 5 based on the temperature monitoring data, a candidate material of sealing ring 5, and a sealing ring cost.

The candidate material of the sealing ring 5 refers to any material that is applied to the sealing ring. For example, the candidate material of the sealing ring 5 may be nitrile rubber, fluoroelastomer, silicone, etc.

In some embodiments, the candidate material of the sealing ring 5 may be obtained directly based on a database. In some embodiments, the candidate material of the sealing ring 5 may also be obtained in other ways. For example, the candidate material of the sealing ring 5 may be obtained based on an input via the user terminal, etc.

The sealing ring cost is a corresponding cost of using the candidate material of the sealing ring 5. In some embodiments, the sealing ring cost may be obtained directly based on the database, or based on the input via the user terminal, etc.

In some embodiments, a target sealing ring 5 cost may be determined based on the temperature monitoring data, the candidate material of the sealing ring 5, and the sealing ring cost, which may include: determining the sealing ring loss by the loss prediction model based on the temperature monitoring data and the candidate material of the sealing ring 5; and determining a sealing ring loss cost based on the sealing ring loss and the sealing ring cost, and determining the target material of the sealing ring 5 based on the sealing ring loss cost.

In some embodiments, an input of the loss prediction model may include temperature monitoring data and the candidate material of the sealing ring 5, and an output of the loss prediction model may include the sealing ring loss. It may be understood that the sealing ring loss here refers to a sealing ring loss corresponding to the candidate material of the sealing ring 5.

The sealing ring loss cost is a loss cost due to sealing ring loss. In some embodiments, the sealing ring loss cost may be a product of the sealing ring cost and the sealing ring loss, i.e., sealing ring loss cost=sealing ring cost*sealing ring loss.

There are a plurality of ways for the processor to determine the target material of the sealing ring 5 based on the sealing ring loss cost. In some embodiments, the candidate material of the sealing ring 5 corresponding to the sealing ring loss cost that is within a preset loss range may be determined as the target material of the sealing ring 5.

In some embodiments, the preset loss range may be determined based on actual requirements.

In some embodiments, the candidate material of the sealing ring 5 corresponding to a minimum sealing ring loss cost may also be determined as the target material of the sealing ring 5.

It may be understood that when the size of the extension portion 2011 or the size of the sealing ring 5 is need to be replaced, an extension portion 2011 with a suitable size is chosen for replacement at the end of a product processing.

In some embodiments, by determining the target material of the sealing ring 5, the user may select a more suitable material for the sealing ring 5 to achieve a sealing function, which not only ensures the sealing performance of the sealing ring 5 but also helps to prolong the service life of the sealing ring 5 and save a cost of later maintenance or replacement.

In some embodiments, the control device may also be configured to determine a target process parameter based on historical product quality and a historical process parameter.

The historical product information refers to a collection of all product information in history. The product information refers to information related to the product. For example, the product information may include material information (including a material type, a material ratio, etc.), size information, shape information, etc.

The historical process parameter refers to a collection of all process parameters corresponding to historical products. The process parameter refers to a parameter related to a sintering bonding process. For example, the process parameter may include initial pressure, a sintering duration, forming pressure, a pressurization duration, a sintering temperature, a ramping rate, etc. In some embodiments, the process parameter may be represented based on vectors.

In some embodiments, there is a correspondence between the historical product information and the historical process parameter, i.e., one historical product information may correspond to one or more historical process parameters.

In some embodiments, the historical product information and the historical process parameter may be directly accessible based on the database. In some embodiments, the historical product information and the historical process parameter may also be obtained based on any other feasible manners.

The target process parameter refers to a process parameter corresponding to a target product. The target product may be a new product.

In some embodiments, based on the historical product information and the historical process parameter, the processor may determine the target process parameter based on a plurality of manners. For example, the target process parameter may be determined based on an algorithmic model, etc.

In some embodiments, the target process parameter is determined based on the historical product information and the historical process parameter, which may include: obtaining the product information of the target product, determining at least one set of candidate process parameters based on the product information of the target product, the historical product information, and the historical process parameter, and determining the target process parameter based on the at least one set of candidate process parameters.

In some embodiments, the processor may obtain the product information of the target product based on an active input of the user via the user terminal. In some embodiments, the processor may also obtain the product information of the target product based on other manners. For example, the product information of the target product is identified and uploaded for obtaining through a smart identification device, etc.

The candidate process parameter is a process parameter that is preferably selected from the historical process parameter. In some embodiments, the candidate process parameter may include one or more sets, which may be determined based on actual situation.

In some embodiments, the processor may perform vector matching based on the product information of the target product and the historical product information to determine at least one set of candidate process parameters. Exemplarily, a vector to be matched may be constructed based on the product information of the target product, and a reference vector may be constructed based on the historical product information. The processor may calculate a distance between the reference vector and the vector to be matched, and the distance between the reference vector and the vector to be matched meeting a preset distance condition is designated as a target vector. The historical process parameter corresponding to the target vector is designated as the process parameter corresponding to the vector to be matched, i.e., the candidate process parameter. The preset distance condition may be set according to the situation. For example, the preset distance condition may be that a vector distance is minimum or the vector distance is less than a distance threshold, etc.

In some embodiments, the processor may perform at least one round of iteration on at least one set of candidate process parameters based on a process score to determine the target process parameter.

In some embodiments, each of the at least one round of iteration may include obtaining the process score of each of the at least one set of candidate process parameters, and transforming the at least one set of candidate process parameters to obtain a transformed process parameter based on the process score.

The process score refers to an indicator that reflects the quality of a process.

In some embodiments, the process score may be determined based on a sintering yield and a sintering cost. Exemplarily, the processor may perform a weighted sum on a sintering yield corresponding to the at least one set of candidate process parameters and a sintering cost corresponding to the at least one set of candidate process parameters to determine a process score corresponding to the at least one set of candidate process parameters.

The sintering yield is a proportion of good products in all processed products after the sintering bonding process. In some embodiments, the sintering yield may be determined based on a quality prediction model.

The quality prediction model is a model used to predict the sintering yield. In some embodiments, the quality prediction model may be a machine learning model. For example, the quality prediction model may include a convolutional neural network (CNN) model, etc.

In some embodiments, an input of the quality prediction model may include the product information of the target product and the at least one set of candidate process parameters, and an output of the quality prediction model may include the sintering yield corresponding to the at least one set of candidate process parameters.

In some embodiments, the quality prediction model may be trained based on a plurality of second training samples with labels. The second training sample may include the product information of the sample target product and sample at least one set of candidate process parameters, and the label may include a sintering yield corresponding to the second training sample. The second training sample may be determined based on historical data. The label may be obtained based on manual labeling, etc.

In some embodiments of the present disclosure, a prediction accuracy of the sintering yield may be improved by processing the product information and the at least one set of candidate process parameters of the target product through the quality prediction model.

The sintering cost is a total cost spent in the sinter bonding process. The sintering cost may include but is not limited to the sealing ring loss cost, etc.

In some embodiments, the sintering cost may be determined based on a pressure magnitude and a pressurization duration, a sintering duration, and the sealing ring loss in the at least one set of candidate process parameters. Exemplarily, the sintering cost may be determined by weighting the pressure magnitude, the pressurization duration, the sintering duration, and the sealing ring loss of the at least one set of candidate process parameters. A corresponding weighting coefficient may be determined based on experiments or computational analysis.

In some embodiments, transforming the at least one set of candidate process parameters may include: randomly selecting two sets of candidate process parameters from the at least one set of candidate process parameters and transforming a parameter of the two sets of candidate process parameters.

In some embodiments, transforming the at least one set of candidate process parameters may further include: randomly selecting a set of candidate process parameters from the at least one set of candidate process parameters, and transforming a parameter of the set of candidate process parameters in a random direction, and a transform magnitude of the parameter may be preset in advance.

In some embodiments, when transforming the at least one set of candidate process parameters, a probability of each of the at least one set of candidate process parameters being selected correlates with its corresponding process score. The higher the process score, the higher the probability of the set of candidate process parameters corresponding to the process score being selected; the lower the process score. The lower the process score, the lower the probability of the set of candidate process parameters corresponding to the process score being selected.

In some embodiments, the processor may determine the target process parameter by performing at least one round of iteration on the at least one set of candidate process parameters when a preset iteration condition is satisfied.

The preset iteration condition refers to a preset condition that makes a plurality of rounds of iteration stop. In some embodiments, the preset iteration condition may include a count of the rounds of iteration not less than a preset count of rounds, etc.

In some embodiments of the present disclosure, the target process parameter is determined based on the at least one round of iteration on the at least one set of candidate process parameters. The probability of the set of candidate process parameters being selected is determined based on its corresponding process score, which not only shortens a process of the plurality of rounds of iteration but also allows an optimal solution to be selected from the at least one set of candidate process parameters, thereby making the target process parameter more reasonable.

In some embodiments, the control device may control an operating parameter (e.g., a power of the pressure component and a power duration) of the pressure component based on a pressure parameter (e.g., an initial pressure, a sintering duration, a forming pressure, and a pressurization duration) of the target process parameter, and control an operating parameter (e.g., a power of the heating component and a power duration) of the heating component (including the upper heating element and lower heating element) based on a temperature parameter (e.g., a sintering temperature and a heating rate) of the target process parameter.

Some embodiments of the present disclosure send a corresponding control instruction to other components of the pressure sintering mechanism based on the target process parameter through the control device to make the other components implement the corresponding target process parameter, which may not only contribute to an improvement of product quality but also ensure the service life of the sealing ring to a certain extent.

FIG. 11 is a schematic diagram illustrating a structure of a sintering device according to some embodiments of the present disclosure.

Some embodiments of the present disclosure also provide a sintering device including a pressure sintering mechanism with a controllable atmosphere.

As shown in FIG. 11, the sintering device may include a frame 8, a drive device 9, a guide rail 10, a fixed support plate 11, and a movable support plate 12.

The frame 8 is a structure used to fix and support the other portions of the sintering device.

In some embodiments, the guide rail 10 is set on the frame 8, the movable support plate 12 is slidingly arranged on the guide rail 10, the upper pressure component 2 is fixed on the movable support plate 12, and the lower pressure component 3 is fixed on the fixed support plate 11.

In some embodiments, the frame 8 may support the fixed support plate 11 and the pressure sensor 14 is arranged between the frame 8 and the fixed support plate 11 to detect a loading pressure of the upper pressure head 201 on the product 15. In addition, the fixed support plate 11 is detachably arranged on the frame 8 below and may also be slidingly arranged on the guide rail 10. When the product 15 is sinstered, the fixed support plate 11 is fixed on the frame 8, and then the sintering position of the product 15 is fixed. Otherwise, when the position of the product 15 or the lower pressure component 3 needs to be adjusted, or relevant parts need to be replaced, the lower pressure component, product, or relevant parts may be disassembled or adjusted by driving the fixed support plate 11 to slide relative to the guide rail 10.

The fixed support plate 11 refers to a structure used to fix the lower pressure component 3. The movable support plate 12 refers to a structure used to fix the upper pressure component 2 and drive the upper pressure component 2 to slide up and down along the guide rail 10.

The drive device 9 refers to a device used to drive the pressure component to move. For example, the drive device 9 may be a cylinder, a motor, etc.

In some embodiments, an output end of the drive device 9 is in a transmission connection with the pressure component slidingly arranged on the guide rail 10 and is used to drive the pressure component to reciprocate linearly along the guide rail 10. The transmission connection refers to a connection that transmits power and motion based on friction between parts or components, including but not limited to belt transmission, gear transmission, chain transmission, worm transmission, etc.

Exemplarily, the output end of the drive device 9 is in the transmission connection with the movable support plate 12 slidingly arranged on the guide rail 10, and based on the movable support plate 12, the upper pressure component 2 fixed thereon is driven to reciprocate linearly along the guide rail 10.

In some embodiments, the drive device 9 and the guide rail 10 may be two different components. For example, the drive device 9 may be an electric motor, the guide rail 10 may be a screw nut mechanism. When operating, the electric motor drives a screw to rotate, and a nut on the screw reciprocates linearly, so that the nut may transmit a power to the movable support plate 12 to implement a pressurization of the upper pressure component 2 on the product 15. As another example, the drive device 9 may be an electric motor, and the guide rail 10 may be a gear and rack mechanism. When operating, the motor drives a gear to rotate through a reducer that improves a torque, the gear and the rack are engaged, and the rack reciprocates linearly, so that the rack may transmit a power to the movable support plate 12 to achieve the pressurization of the upper pressure component 2 on the product 15.

In some embodiments, the drive device 9 and the guide rail 10 may also be the same component. For example, when the driving device 9 is a cylinder, a cylinder body is fixed to the frame 8, and a piston rod of the cylinder transmits the power to the movable support plate 12 to realize the pressurization of the upper pressure component 2 on the product 15. At this time, the cylinder body is equivalent to the guide rail 10.

In some embodiments, the heat insulating plate 13 is arranged between the movable support plate 12 and the pressure component (i.e., the upper pressure component) above the movable support plate 12, and the heat insulating plate 13 is also arranged between the fixed support plate 11 and the pressure component (i.e., the lower pressure component) above the fixed support plate 11.

The heat insulating plate 13 refers to a plate used to reduce heat transmission from the heating component. A structure of the heat insulating plate 13 includes but does not limited to a porous structure, etc.

In some embodiments of the present disclosure, by arranging the heat insulating plate 13 between the two pressure components and corresponding support plates (e.g., the fixed support plate and the movable support plate), respectively, the heat transmission and diffusion from the heating component may be reduced to avoid an excessive temperature in other components of the sintering device (e.g., the frame, etc.), thereby improving a safety coefficient of the sintering device.

Having thus described the basic concepts, it may be rather apparent to those skilled in the art after reading this detailed disclosure that the foregoing detailed disclosure is intended to be presented by way of example only and is not limiting. Although not explicitly stated here, those skilled in the art may make various modifications, improvements, and amendments to the present disclosure. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment" "an embodiment," and/or "some embodiments" mean that a particular feature, structure or feature described in connection with the embodiment is included in at least one embodiment of the present disclosure. Therefore, it is emphasized and should be appreciated that two or more references to "an embodiment" or "one embodiment" or "an alternative embodiment" in various portions of the present disclosure are not necessarily all referring to the same embodiment. In addition, some features, structures, or characteristics of one or more embodiments in the present disclosure may be properly combined.

Furthermore, the recited order of processing elements or sequences, or the use of numbers, letters, or other designations therefore, is not intended to limit the claimed processes and methods to any order except as may be specified in the claims. Although the above disclosure discusses some embodiments of the invention currently considered useful by various examples, it should be understood that such details are for illustrative purposes only, and the additional claims are not limited to the disclosed embodiments. Instead, the claims are intended to cover all combinations of corrections and equivalents consistent with the substance and scope of the embodiments of the invention. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure does not mean that object of the present disclosure requires more features than the features mentioned in the claims. Rather, claimed subject matter may lie in less than all features of a single foregoing disclosed embodiment.

In some embodiments, the numbers expressing quantities or properties used to describe and claim certain embodiments of the present disclosure are to be understood as being modified in some instances by the term "about," "approximate," or "substantially. For example, "about," "approximate" or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes. History application documents that are inconsistent or conflictive with the contents of the present disclosure are excluded, as well as documents (currently or subsequently appended to the present specification) limiting the broadest scope of the claims of the present disclosure. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the present disclosure disclosed herein are illustrative of the principles of the embodiments of the present disclosure. Other modifications that may be employed may be within the scope of the present disclosure. Thus, by way of example, but not of limitation, alternative configurations of the embodiments of the present disclosure may be utilized in accordance with the teachings herein. Accordingly, embodiments of the present disclosure are not limited to that precisely as shown and described.

What is claimed is:

1. A pressure sintering mechanism with a controllable atmosphere, comprising:
    a telescopic tube, wherein at least a part of the telescopic tube is an elastically telescopic bellows section;
    two pressure components arranged opposite to each other, wherein the telescopic tube is configured between the two pressure components, the two pressure components are configured to seal an opening of an end of the telescopic tube when the two pressure components are close to each other to form a sealed sintering chamber inside the telescopic tube and apply pressure to a product inside the sintering chamber; and
    a heating component configured to heat the product inside the sintering chamber;
    wherein two ends of the telescopic tube are respectively a fixed end and a free end, one of the pressure components is fixedly sealed and connected to the fixed end of the telescopic tube to seal an opening of the fixed end of the telescopic tube, and the other one is arranged opposite to an opening of the free end of the telescopic tube;
        wherein the two pressure components consist of an upper pressure component and a lower pressure component, the upper pressure component is located above the lower pressure component, the fixed end of the telescopic tube is fixedly connected to the upper pressure component, and a sealing ring is arranged between the fixed end of the telescopic tube and the upper pressure component;
        wherein the lower pressure component includes a lower pressure head, the lower pressure head has a lower heating chamber and an insulating venting slot surrounding outside of the lower heating chamber, the lower heating chamber has an opening facing downward and the insulating venting slot has an opening facing upward, and the insulating venting slot is connected to the sintering chamber when the telescopic tube forms the sintering chamber;
an annular slot is arranged on an upper surface of the lower pressure head or the free end of the telescopic tube, a sealing ring is embedded in the annular slot, and the insulating venting slot is located on an inner side of the sealing ring;
the heating component includes a lower heating element, the lower heating element is configured within the lower heating chamber; and
an outer wall of the lower pressure head is arranged with an air inlet and an air outlet, and the air inlet and the air outlet are connected to the insulating venting slot.

2. The pressure sintering mechanism with the controllable atmosphere of claim 1, wherein the upper pressure component includes an upper pressure head, the upper pressure head has an extension portion protruding downwardly from a lower surface of the upper pressure head, and the extension portion extends into the telescopic tube; and
the heating component includes an upper heating element arranged on the upper pressure head.

3. The pressure sintering mechanism with the controllable atmosphere of claim 2, wherein an upper heating chamber is arranged downwardly on an upper surface of the upper pressure head, a bottom end of the upper heating chamber is located in the extension portion, and the upper heating element is arranged on the bottom end of the upper heating chamber; and
the upper pressure component further includes an upper pressure head base located above the upper pressure head, the upper pressure head base is fixedly connected to the upper pressure head and seals an upper end opening of the upper heated chamber, and the fixed end of the telescopic tube is fixedly connected to the upper pressure head base or the upper pressure head.

4. The pressure sintering mechanism with the controllable atmosphere of claim 1, wherein the lower pressure head has a projection portion protruding upwardly corresponding to an upper surface of the lower heating chamber, and the insulating venting slot is located on an outer side of the projection portion.

5. The pressure sintering mechanism with the controllable atmosphere of claim 1, wherein the insulating venting slot is arranged with two partitions and is separated by the two partitions to form an air inlet slot and an air outlet slot, the air inlet is connected to the air inlet slot, and the air outlet is connected to the air outlet slot.

6. The pressure sintering mechanism with the controllable atmosphere of claim 5, wherein an upper end opening of the insulating venting slot is covered with a rectification plate, a plurality of through holes downwardly run through the rectification plate from an upper surface of the rectification plate, the plurality of through holes are evenly distributed circumferentially along the insulating venting slot and are connected to the insulating venting slot.

7. A sintering device, wherein the sintering device comprises the pressure sintering mechanism with the controllable atmosphere of claim 1.

8. The sintering device of claim 7, wherein the sintering device further comprises a frame, a drive device, a guide rail, a fixed support plate, and a movable support plate; wherein
the guide rail is set on the frame, and the movable support plate is slidingly arranged on the guide rail;
the frame supports the fixed support plate, and a pressure sensor is arranged between the frame and the fixed support plate;
the two pressure components are fixed to the movable support plate and the fixed support plate, respectively; and
an output end of the drive device is connected to the two pressure components slidingly arranged on the guide rail and is configured to drive the pressure components to reciprocate linearly along the guide rail.

9. The sintering device of claim 7, wherein a heat insulating plate is arranged between the movable support plate and a pressure component above the movable support plate, and a heat insulating plate is arranged between the fixed support plate and a pressure component above the fixed support plate.

* * * * *